US000001296H

United States Statutory Invention Registration [19]

[11] Reg. Number: H1296

[43] Published: Apr. 5, 1994

Simmons et al.

[54] OPTICAL SWITCHING DEVICE AND PARALLEL PROCESSING ARCHITECTURE

[75] Inventors: Joseph H. Simmons, Gainesville, Fla.; Henry D. Dardy, Upper Marlboro, Md.

[73] Assignee: United States of America, Washington, D.C.

[21] Appl. No.: 878,182

[22] Filed: Apr. 30, 1992

[51] Int. Cl.[5] ..... G02F 3/00

[52] U.S. Cl. ..... 385/16; 385/15; 359/107; 359/108; 359/244; 365/215; 365/234

*Primary Examiner*—Bernarr E. Gregory

*Attorney, Agent, or Firm*—Thomas E. McDonnell; Daniel Kalish

[57] ABSTRACT

A multiple-faced optical device comprising a light-responsive element having multiple faces, at least two of the faces constituting input faces for receipt of non-collinear light signals and at least one of the faces other than the input faces constituting an output face from which light signals transmitted through the light-responsive element are emitted. The light-responsive element is further configured to have optically-induced non-linear susceptibility to light signals transversely propagated through the light-responsive element such that at least one portion of the light-responsive element switches between two stable optical states in dependence on the total intensity of the light signals within the light-responsive element. The above-described optical device can be configured to perform various operations, such as AND/OR and INVERT/PASS logic operations, data line branching, signal time delay, and memory storage. An array of such devices provides parallel logic processing on a plurality of parallel optical data paths.

7 Claims, 7 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

OPTICAL SWITCHING DEVICE AND PARALLEL PROCESSING ARCHITECTURE

BACKGROUND OF THE INVENTION

The present invention relates generally to optical logic processing, and more particularly to digital optical processing devices and computer architectures suitable for large scale parallel processing.

Bistable optical or opto-electronic logic devices have been developed which are capable of performing basic logic operations (e.g., AND, OR, NAND, NOR) and to perform various combinational logic. Examples of such devices are disclosed in U.S. Pat. Nos. 3,431,437 to Kosonocky; 4,128,300 to Stotts et al.; 4,262,992 to Berthold, III; and 4,382,660 to Pratt, Jr. et al. Fabry-Perot cavities responsive to collinear input signals have also been developed which exhibit high-speed switching and the ability to perform logic operations. See "The Optical Computer," E. Abraham, C. T. Seaton S. D. Smith, Sci. Amer. Feb., 1983, pp. 85 et seq.; "Selected Papers on Optical Computing," H. J. Caulfield, G. Gheen (eds.), SPIE 1142, pp. 79 et seq.; "Optical Bistability: Controlling Light With Light," H. M. Gibbs, Academic Press, 1985; "From Optical Bistability Towards Optical Computing, The EJOBP," P. Mandel, S. D. Smith, B. S. Wherrett (eds.), North Holland, Elsevier Science Publishers, 1987; "Optical Computing, A Survey for Computer Scientists," D. G. Feitelson, MIT Press, 1988, pp. 147 et seq.; "Optical Computing 88," J. W. Goodman, P. Chavel, G. Roblin (eds.), Proc. SPIE, 963 (1989), pp. 15 et seq., 138 et seq.

The development of a digital computer employing optical logic elements is desirable because optical switching and gate elements are capable of outperforming their electronic counterparts in particular areas which are essential in the development of improved computing devices. Specifically, optical switching and gate elements have the potential to provide, inter alia, high speed, large scale parallel processing capabilities.

However, the bistable optical logic elements and computer architectures using such elements which have heretofore been developed have not taken full advantage of the features of nonlinear material nor of the intrinsic parallel nature of optical signal processing.

SUMMARY OF THE INVENTION

Accordingly, it is an object of the present invention to provide optical digital logic devices and computer architectures which provide purely optical high speed parallel processing.

It is a further object of the present invention to provide optical logic elements responsive to non-collinear input signals and capable of performing different selected logic functions in dependence on a programmable optical control signal.

It is another object of the present invention to provide an array of optical logic elements which is particularly adapted to provide programmable parallel processing.

It is still another object of the present invention to provide an optical parallel memory architecture which is capable of large-scale simultaneous transfer of stored data using a single optical read signal.

These and other objects are achieved in accordance with one aspect of the present invention by a multiple-face optical element comprising a light-responsive element multiple faces. At least two of the faces constitute input faces for receipt of non-collinear light signals and at least one of the faces other than the input faces constitutes an output face from which light signals transmitted through the light-responsive element are emitted. The light-responsive element is further configured to have optically-induced non-linear susceptibility to light signals transversely propagated through the light-responsive element such that at least one portion of the light-responsive element switches between two stable optical states in dependence on the total intensity of the light signals within the light-responsive element.

In accordance with a further aspect of the present invention, a programmable optical logic array device for parallel processing of at least one set of first and second non-collinear optical data signals along first and second data paths comprises an AND/OR optical gate controllable by a first optical program signal for selectively operating in an AND/OR logic mode to produce corresponding first AND/OR second data output signals in dependence on the combination of data input signals present and the logic mode selected; a PASS/INVERT optical gate responsive to one of the first and second data output signals from the AND/OR optical gate and controllable by a second optical program signal for selectively operating in PASS or INVERT modes wherein, respectively, a PASS data output signal is produced in the same data path when the one of the first and second data output signals is present and an INVERT data output signal is produced in a different data path when the one of the first and second data output signals is not present; and a BRANCHING optical gate responsive to the PASS and INVERT data output signals from the PASS/INVERT optical gate and controllable by a third program signal for selectively operating to transfer PASS/INVERT data output signals applied as inputs along the same data path as, or a different data path from, the one on which the applied PASS/INVERT signal was travelling prior to transfer.

These and other objects, features and advantages of the present invention are described in or apparent from the following detailed description of preferred embodiments.

BRIEF DESCRIPTION OF THE DRAWINGS

The preferred embodiments will be described with reference to the accompanying drawing, in which like elements have been denoted with like reference numbers, and wherein.

DETAILED DESCRIPTION OF THE PREFERRED EMBODIMENTS

Figure 1A:
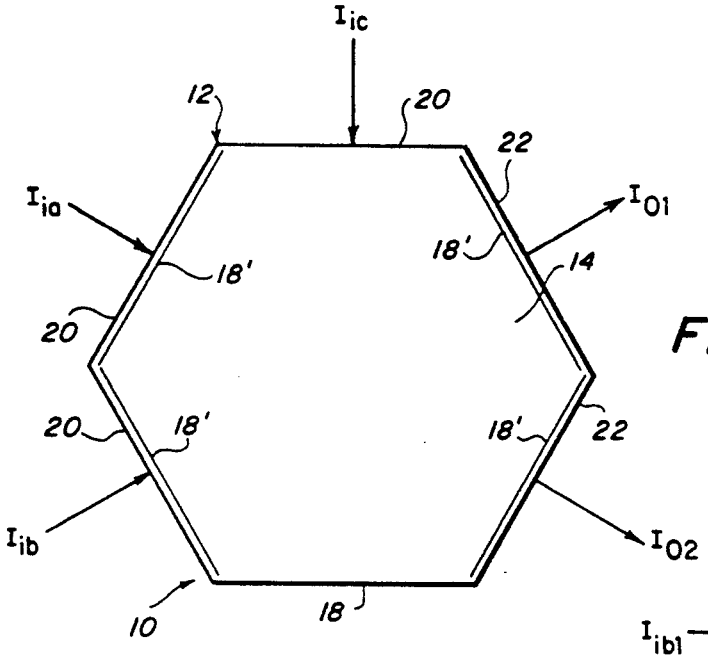
FIGS. 1A–1D are diagrammatic illustrations of exemplary embodiments of a multi-faceted optical element in accordance with the present invention.
Figure 1C:
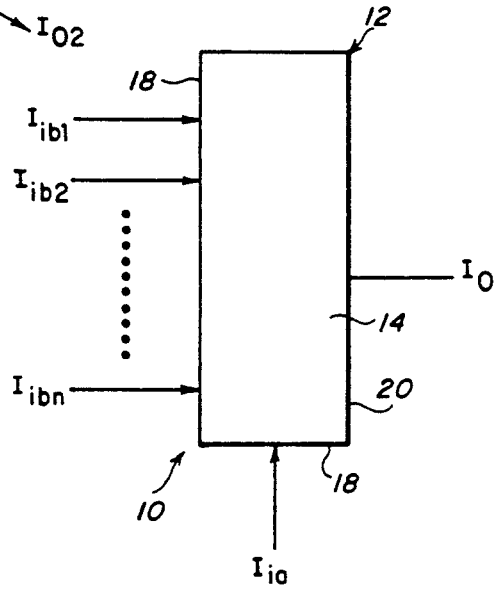
Figure 1B:
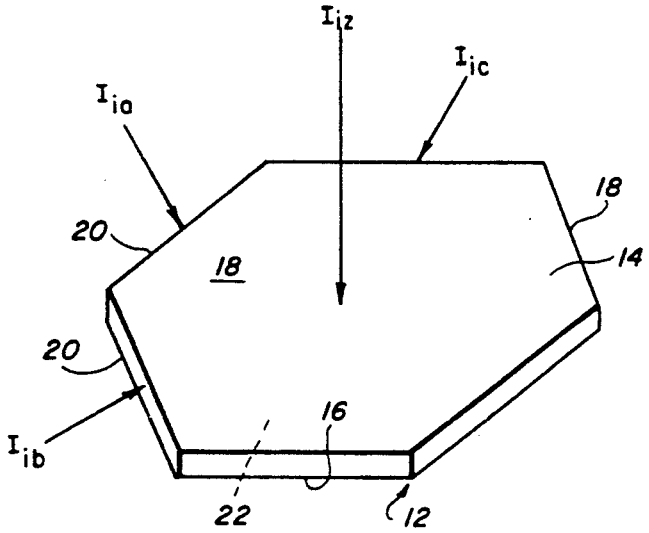

In accordance with one aspect of the present invention, parallel optical digital processing is achieved utilizing multiple-face optical logic devices. Referring to FIGS. 1A–1C, an optical element basically comprises a bistable light-responsive element 12 having multiple side faces 18. At least two of the faces constitute input faces 20 for receipt of non-collinear light beams or signals $I_i$, i.e., light signals having greater than approximately a 15° angle of separation. At least one of the faces other than the input faces constitutes a corresponding at least one output face 22 from which light beams transmitted through element 12 are emitted as output signals $I_O$. All of the input signals $I_i$ may constitute data signals, as shown in FIGS. 1A–1C, but as is described in more detail hereinbelow, one of the input signals preferably constitutes a control or program signal $I_p$ for controlling the operations performed by a gate or switch 10.

Optical element 10 is further configured to have an optically-induced non-linear susceptibility to light signals at a predetermined wavelength transversely propagated through light-responsive element 12 such that at least one portion or cell of element 12 switches between two stable states depending on the total light intensity of the proper wavelength in the cell. Thus, when the total light intensity in element 12 is less than a predetermined threshold level or trigger intensity $I_{th}$, the element 12 is in its OFF state, wherein passage of signals through the element 12 is prevented; and when the total light intensity is equal to or greater than trigger in tensity $I_{th}$, the element 12 is in its ON state, wherein passage of light signals through the cavity is permitted.

Figure 2:
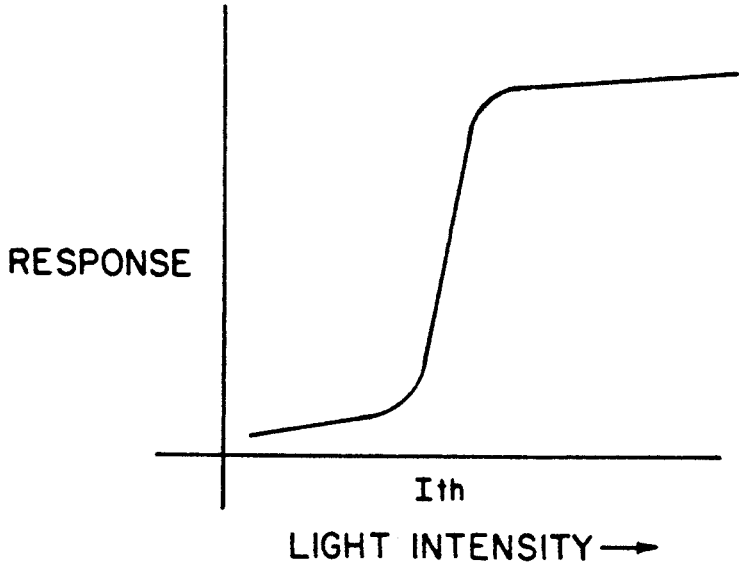
FIG. 2 is a representation of a single valued response to total light intensity of the optical element shown in FIGS. 1A–1D.
Figure 3:
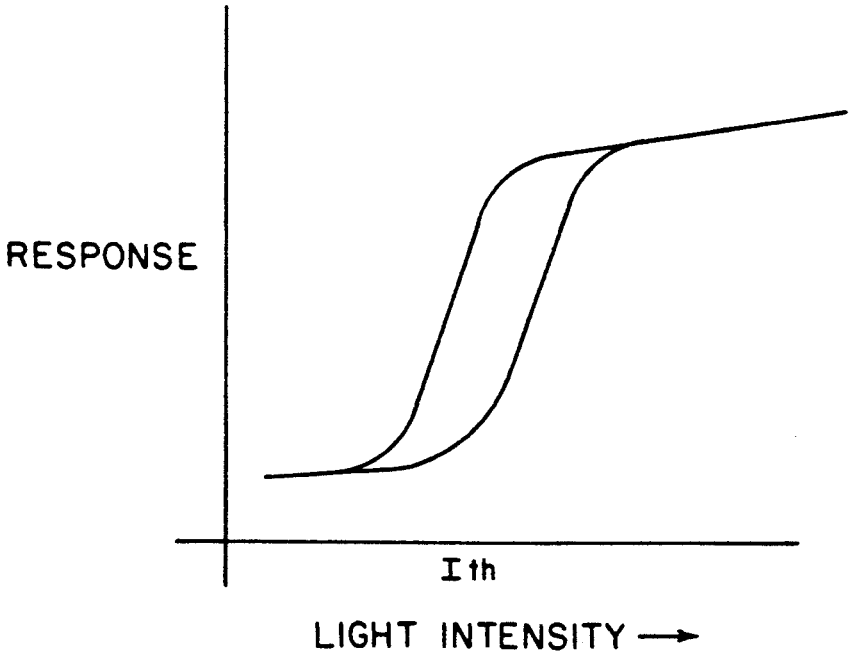
FIG. 3 is a representation of a hysteresis response to total light intensity of the optical element shown in FIGS. 1A–1D.

In the preferred embodiment, the two stable states are due to an essentially flat response to light intensity over two distinct intensity regions, and a highly sensitive response to light intensity at or around the trigger intensity, as shown in FIG. 2. There may be a hysteresis effect, as shown in FIG. 3, in which the actual response at and near the trigger intensity may be effected by the optical history of element 12. It is appreciated that these response graphs of FIGS. 2 and 3 are representative, and that the actual response may differ. For example, the higher response may correspond to a lower intensity, and the response need not be a monotonic function of the total light intensity.

It is preferable that element 12 have at least one optical resonant cavity (not shown) and an optically nonlinear material (not shown) within said resonant cavity, said nonlinear material having a parameter, such as refractive index, which varies nonlinearly with the total intensity. The Airy function of such an embodiment is conducive to properties desired in the present invention.

Figure 1D:
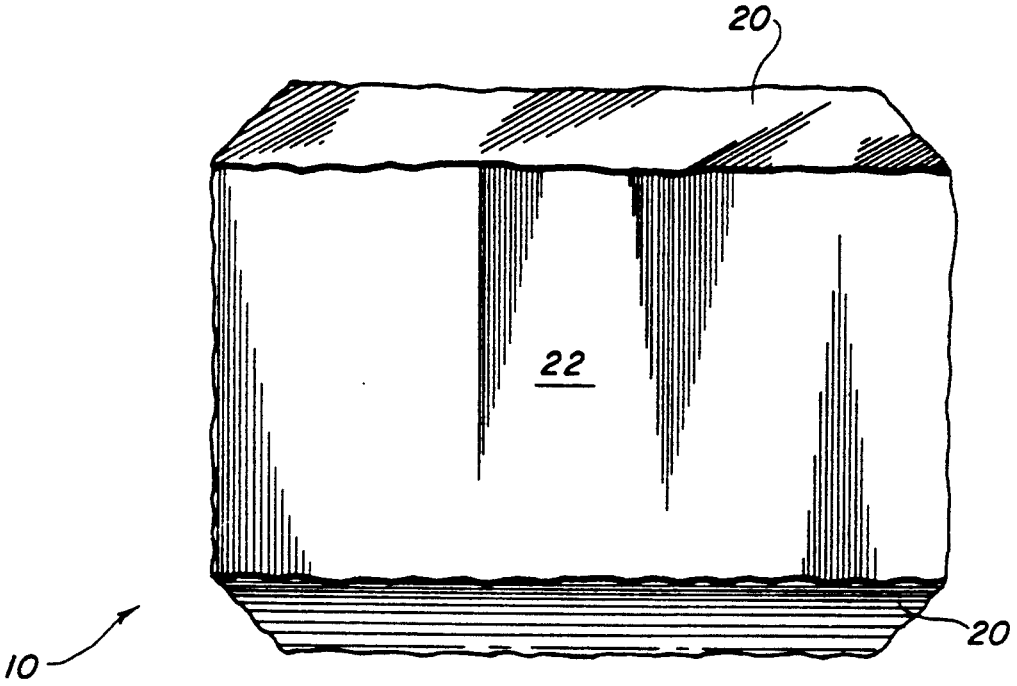

One or more multi-dimensional bi-stable Fabry-Perot cavities made from suitable available semiconductor materials, including InSb, ZnS, ZnSe, ZnTe, CdS, CdTe, GaAs, $CuCl_2$ and the ternary and quaternary semiconductor alloys, for example, may also advantageously constitute element 12. It will also be appreciated that while hexagonal and rectangular exemplary embodiments of optical element 10 have been shown in FIGS. 1A–1C, any geometry providing flat faces, as shown in FIG. 1D, is suitable. As shown diagrammatically in FIG. 1A, selected faces 18 of optical element 10 advantageously are mirrored, as is conventional.

Figure 10A:
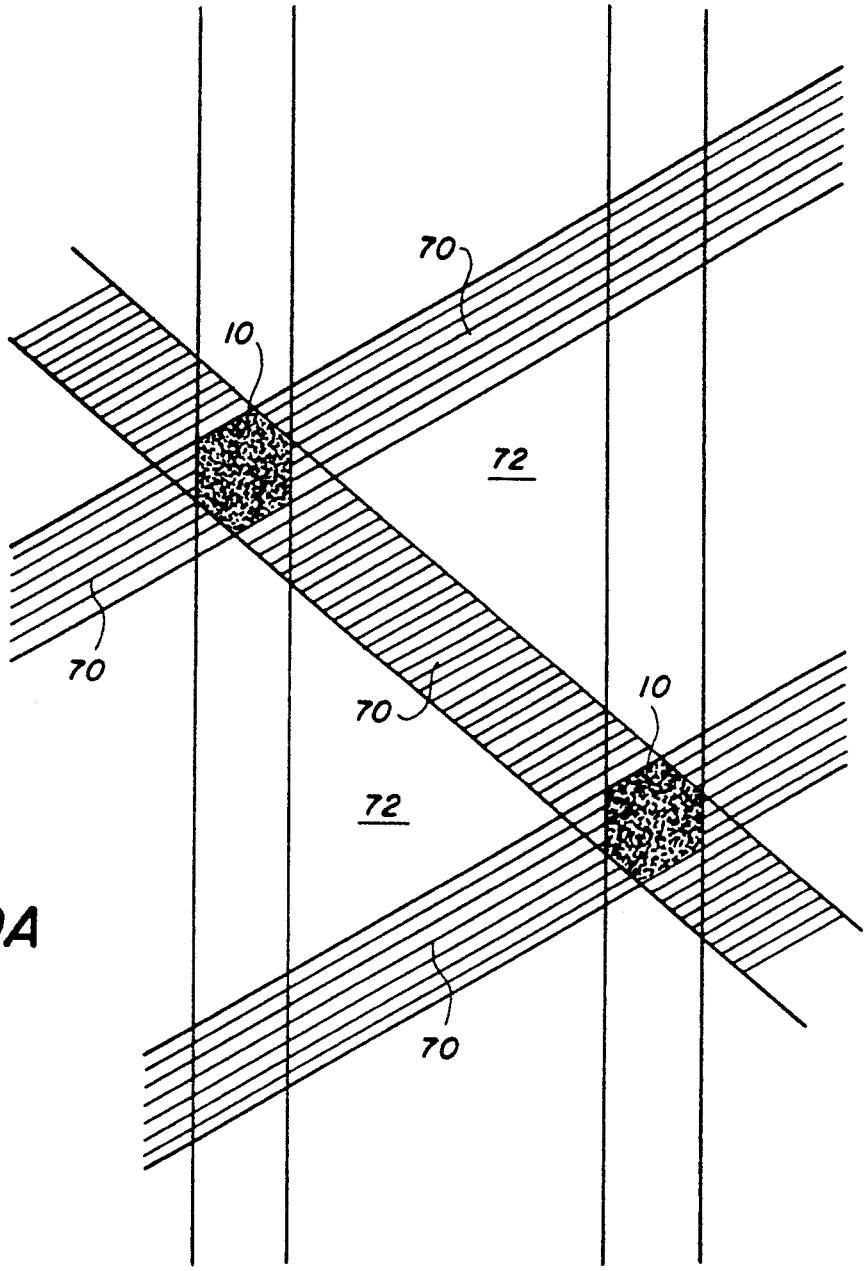
FIGS. 10A and 10B are top and side views of an array of optical elements with channel waveguides between elements.
Figure 10B:
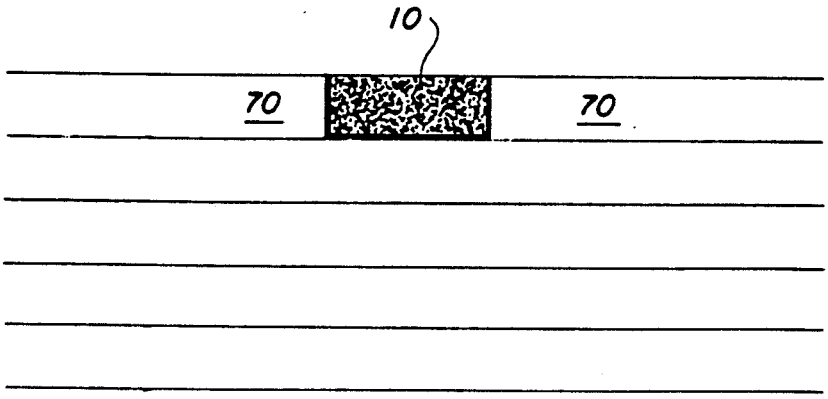

An array of the optical elements 10 according to the present invention may be fabricated employing standard fabrication techniques for channel waveguides using currently known art lithography techniques. In the alternative, ion implantation and dopant diffusion could be used. As shown in FIGS. 10A and 10B, these techniques permit the fabrication of optical waveguides 70 and optical logic devices 10 having different indices of refraction than the substrate 72.

Preferably, the input light beams/signals strike directly and perpendicularly on the input faces and the input faces should each constitute one side of a resonant Fabry-Perot cavity. Other than in the resonant cavities, there should not be any processing of the signals between the input ports and the output ports, such as by mirrors or lenses.

The output signal should be suitable for use as an input signal by another optical element according to this invention. In other words, the optical elements are cascadable. They employ frequency standards and intensity standards corresponding to ON and OFF states. It is understood that means, such as "holding beams," may be employed by persons skilled in the art to fine tune the response of element 10. It will also be understood that timing, clock, and storage means may be employed by persons skilled in the art to synchronize signals in the system.

It is preferable that the beams be transmitted directly between the elements, without the use of fibers, mirrors or lenses, and with only minimal processing, such as for amplification, correction of corruption, or in general, conformance with standards.

Figure 4:
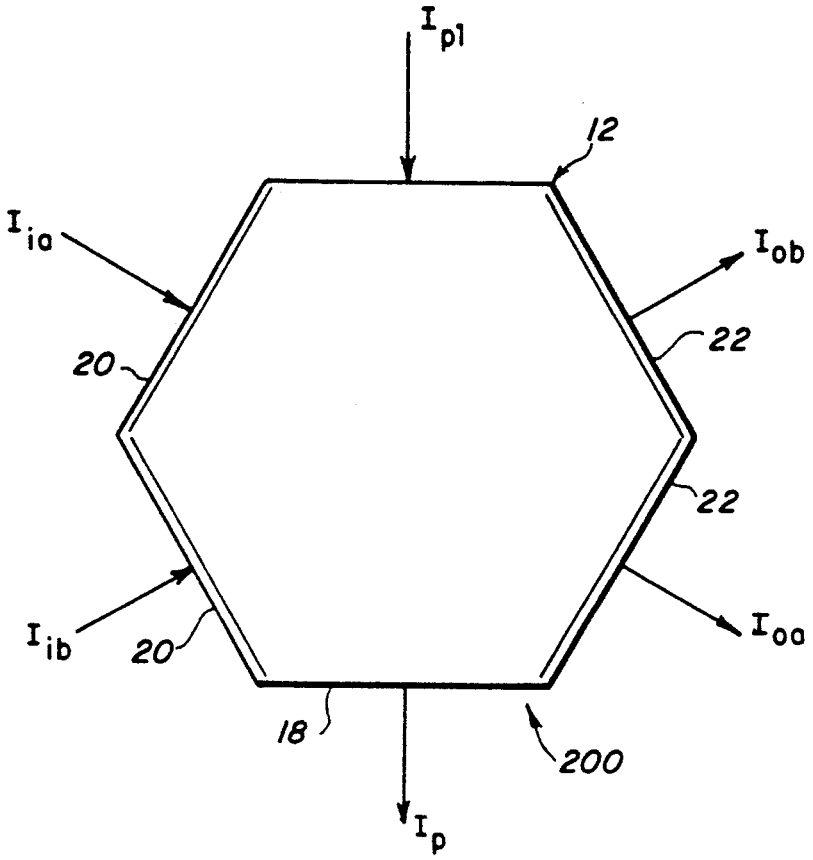
FIG. 4 is a diagrammatic illustration of a programmable AND/OR gate embodiment of the optical element of the present invention.

As mentioned above, in accordance with a further aspect of the present invention, operation of an optical element 10 to perform predetermined logic and other operations is controlled by using the input signal to one of the input faces 18 as a program signal $I_p$; and further by modifying the configuration of light-responsive element 12, as described in more detail hereinbelow. Referring specifically to FIG. 4, AND and OR logic operations can be obtained using an optical element 200 having the same construction as element 10 described hereinabove with two or more data input signal $I_i$ and one program signal $I_{pl}$ (two data input signal $I_{ia}$ and $I_{ib}$ are shown). The intensities of data input signal $I_i$ are selected to each equal at least ½, but less than the full trigger intensity $I_{th}$, that is $0.5I_{th} \leqq I_{ia,b} < I_{th}$. Consequently, when the intensity of program signal $I_{pi}$ is set equal to zero, true AND gate operation is achieved, i.e., switch 200 is triggered ON and outputs $I_{oa}$ and $I_{ob}$ are produced only when both data input signals $I_{ia}$ and $I_{ib}$ are present (ON). By setting the intensity of program signal $I_{pl}$ to also be $0.5I_{th} \leqq I_{pl} < I_{th}$, inclusive OR gate operation is achieved, i.e., switch 200 is triggered ON and the corresponding output $I_{oa}$, $I_{ob}$ is produced when either data input signal $I_{ia}$, $I_{ib}$ is present (ON), and switch 200 is OFF, producing no output, when neither data input signal is present.

It will be appreciated that an AND gate (not shown) may be similarly obtained by employing an optical element according to the present invention, which optical element has 2 input faces and 1 output face, and is designed to operate as the above-described AND/OR gate without any program signal $I_{pi}$ or program beam or a face for input of same.

It will also be appreciated that a dedicated OR gate may be implemented by using the aforementioned AND/OR gate with a steady beam of intensity $0.5I_{th} \leq I_{pl} < I_{th}$.

Figure 5:
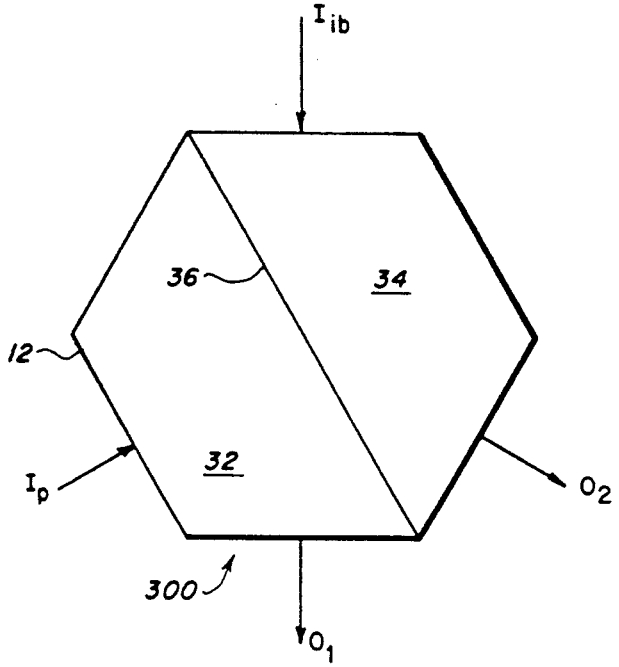
FIG. 5 is a diagrammatic illustration of a programmable PASS/INVERT gate embodiment of the optical element of the present invention.

Referring specifically to FIG. 5, INVERT/PASS logic operation is achieved in accordance with the present invention as follows. A compound optical element 300 is formed with a light-responsive element 12 having two portions with substantially equal optically variable nonlinear refractive indices $N_1$ and $N_2$ arranged so as to form two separately switchable cells 32 and 34 defining an interface 36 extending obliquely with respect to the signal path of one of the data input signals $I_i$ (e.g., $I_{ib}$ as shown in FIG. 5) and transversely with respect to a program signal $I_{p2}$ as shown.

Two output ports $O_1$ and $O_2$ are provided on INVERT/PASS element 300. The element 300 is designed so that if the program signal is OFF and the data signal is ON, then the refractive index $N_1$ for cell 32 is less than the refractive index $N_2$ for cell 34. An ON data signal would be reflected at interface 36 and would appear at output port $O_2$. The INVERT/PASS gate 300 is further designed so that if the program signal is ON and the data signal is ON, then the refractive indices $N_1$ and $N_2$ are essentially equal, and so that cell 32 is in the transmit mode. The ON data signal would be transmitted through interface 36 and cell 32, and would appear at output port $O_1$. Following is the truth table for this device:

| Input | $O_1$ | $O_2$ |
|---|---|---|
| Data OFF, Program OFF | OFF | OFF |
| Data ON, Program OFF | OFF | ON |
| Data OFF, Program ON | OFF | OFF |
| Data ON, Program ON | ON | OFF |

It can be seen that if the program signal is OFF, then the state of output $O_2$ corresponds to the state of the input data, whereas if the program signal is ON, then the state of output $O_1$ is the inverse of the input data state.

Figure 6A:
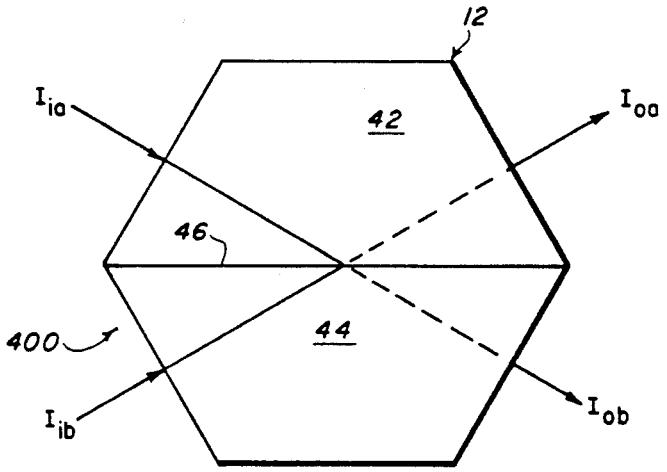
FIGS. 6A–6B are diagrammatic illustrations of a programmable branching element embodiment of the optical element of the present invention.
Figure 6B:
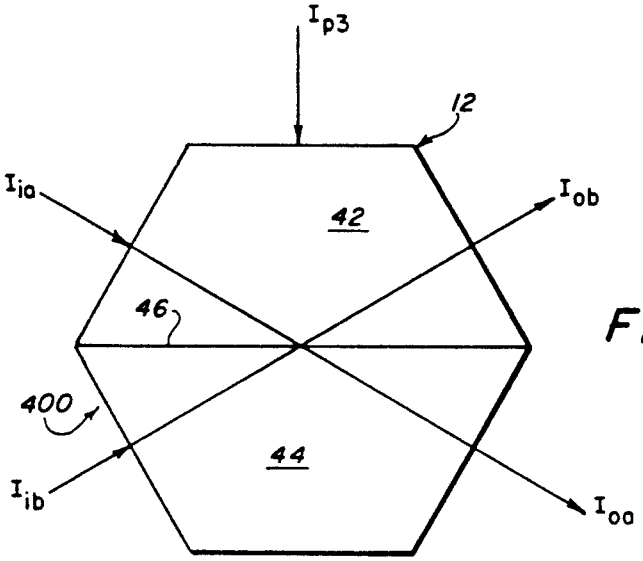

Referring specifically to FIGS. 6A and 6B, data line branching is achieved in accordance with the present invention using a compound optical element 400 similar in construction to switch 300 described hereinabove, but with the interface 46 between cells 42 and 44 oriented transversely to program signal $I_{p3}$ and obliquely with respect to both data input signals $I_{ia}$ and $I_{ib}$. When program signal $I_{p3}$ is not present (OFF) (FIG. 6A), then whichever input signal $I_{ia}$, $I_{ib}$ is present will be reflected by interface 46 (since only the corresponding cell 42, 44 is triggered ON, creating unequal refractive indices in the two cells), thus producing output signals $I_{oa}$ and $I_{ob}$ with transposed data paths. When program signal $I_{p3}$ is present (ON) (FIG. 6B), both cells 42 and 44 are triggered ON, and both input signals $I_{ia}$, $I_{ib}$ will respectively pass directly through switch 400 without reflection at interface 46 to respectively produce corresponding output signals $I_{oa}$, $I_{ob}$ in the same data paths.

Figure 7:
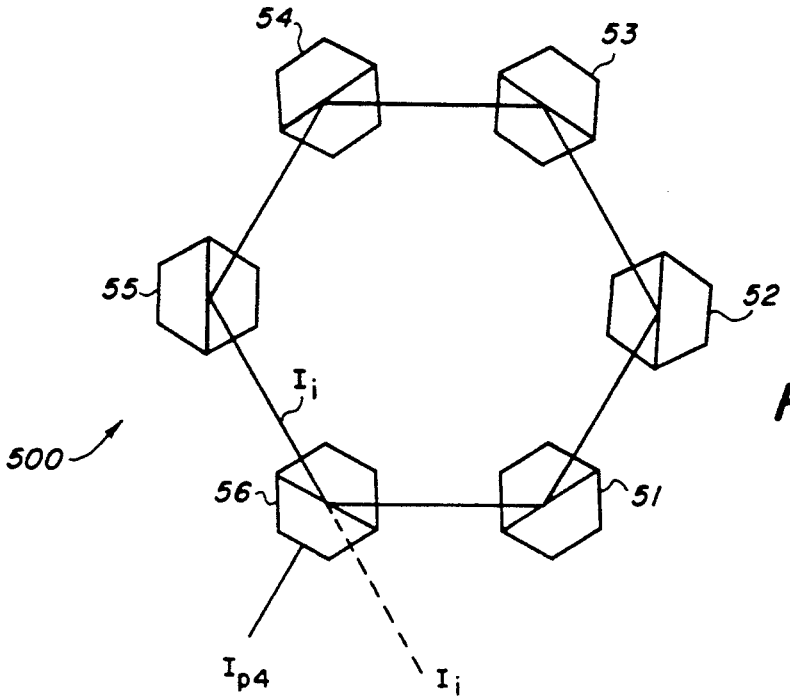
FIG. 7 is a diagrammatic illustration of an optical temporary memory or signal time delay in accordance with the present invention.

Referring specifically to FIG. 7, signal time delay or temporary memory storage can be achieved in accordance with the present invention by providing an array 500 of gates/switches 51–56 having the construction of branching switch 400 described above and arranged to successively branch the data path of an input data signal $I_i$ in a closed loop back to a starting switch, e.g., switch 56, of the array 50. Thus, a data signal can enter the loop at any switch in the array 50, and can be retrieved from the same or a different switch in the loop simply by providing a program signal $I_{p4}$, as shown at switch 56, to cause the circulating signal $I_i$ to pass directly through the fully ON switch without reflection at the switch interface.

Figure 8:
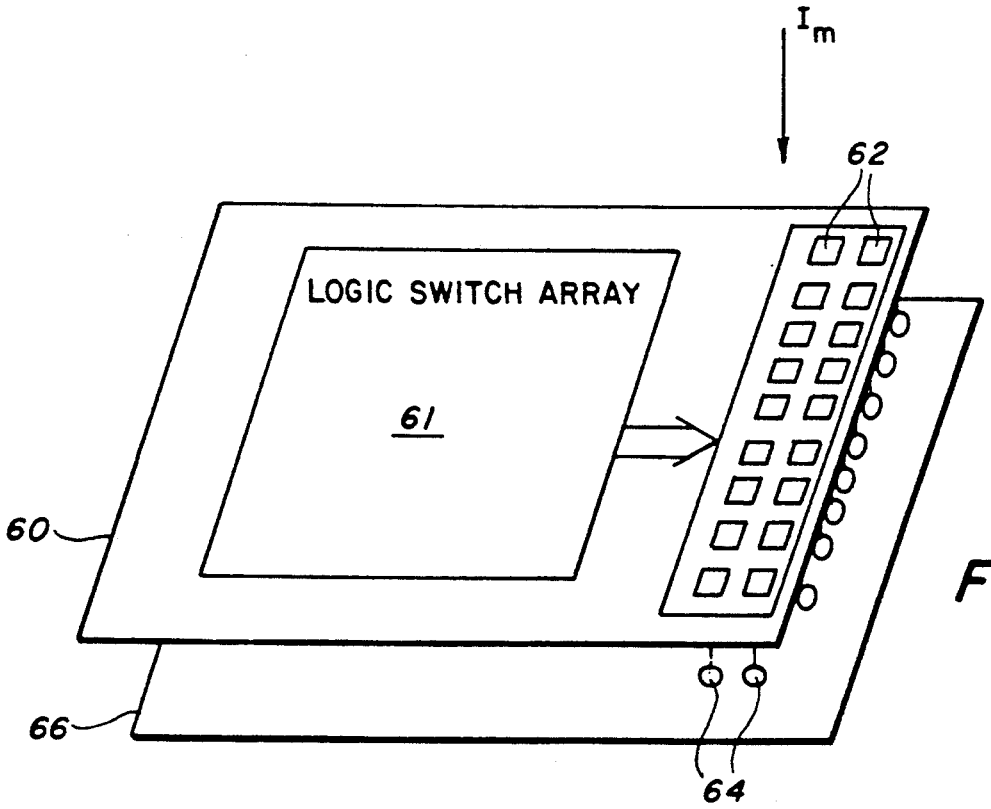
FIG. 8 is a diagrammatic illustration of a parallel memory architecture in accordance with the present invention.

It will be appreciated that memory storage can also be achieved in accordance with the present invention using biased bistable switches as well as the optical closed loop arrays of nonbiased switches described above. In either case, the memory state can be determined by the condition of the switch/array. To provide maximum parallelism in the operation of optical computer architectures in accordance with the present invention, the memory storage area of a processor advantageously is arranged such that all memory cells (switches or arrays) may be read simultaneously. As shown diagrammatically in FIG. 8, this is achieved in accordance with the present invention by arranging together on one plane 60 in a common area the optical elements of the present invention constituting the memory cells 62. For example, the common area may be the terminus of a series of data paths from a logic switch array 61. A further array of optical elements or electrical photoreceptor devices 64 is arranged in a separate plane 66 beneath memory cells 62. Since the memory cells 62 can be designed to act as Fabry-Perot cavities between their top and bottom faces, an array of memory cells 62 can be read simultaneously by illuminating the entire array by a single reading light beam $I_m$ having an intensity less than the trigger intensity $I_{th}''$ of the memory cells 62 applied to the top faces of the memory cells. The cells 62 of the array which are ON transmit the reading beam $I_m$ light to the underlying array of devices 74, while the cells 62 which are OFF do not. If optical elements constitute devices 64, then a new set of logic operations could be commenced with the light signals transmitted from memory cells 62. If photoreceptors constitute devices 64, the electrical outputs produced by the photoreceptors could be used to interface with a host electronic computer.

Other similar optical logic gates may be readily designed in accordance with the present invention.

Figure 9:
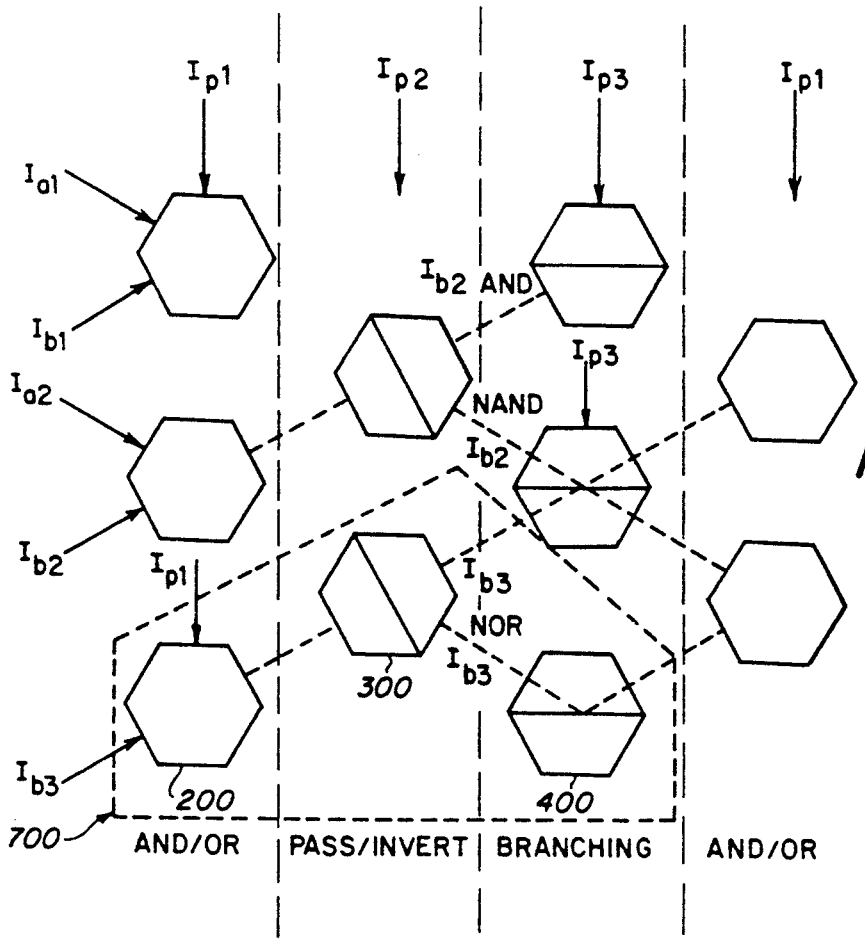
FIG. 9 is a diagrammatic illustration of a programmable logic array in accordance with the present invention.

To provide optimal parallel logic processing in accordance with the present invention, the AND/OR, INVERT/PASS and branching element switches 200, 300 and 400 described hereinabove preferably are arranged in sequence as shown in FIG. 9 to form programmable logic unit arrays 700 which define at least two parallel data paths A and B and which perform successive logic operations on data signals travelling along the data paths A, B. As is also shown, logic unit arrays 700 advantageously are arranged so that the respective switches 200, 300 and 400 form columns, with the switches in each column being controlled by a common program signal $I_{p1}$, $I_{p2}$, $I_{p3}$, and with a separate set of data paths A, B addressing one switch per column so that data is propagated across columns. Consequently, in accordance with the present invention, data can be propagated in parallel along a pair of data paths through a programmable logic array and can interact according to program signals. As many pairs of data paths as desired can be provided simply by extending the length of the switch columns, subject only to the need to boost the program signal power for very long column lengths. Similarly, the number of operations performed in each pair of data paths is limited only by the need to provide regular boosting of data signal intensities. Further, for more complex data processing, the number of addressable data paths in each logic unit array 700 can be increased simply by changing the geometry of the optical elements 200, 300, 400, such as by using octagonal or 12-sided configurations instead of the illustrated hexagonal configuration.

It is understood that other similar digital optical computing systems can be readily designed in accordance with the present invention. For example, switching elements may serve to control program branching and data flow. This invention may be readily adapted for vector processing, parallel processing, pipelining, and neural networks.

It will be appreciated from the foregoing that the present invention provides intrinsically parallel optical switch elements because they may be addressed simultaneously by several non-collinear, independent optical signals which can be separated at the output of a switch, and because an entire array of such switches can also be addressed simultaneously with a single light beam normal to the plane of the switches. The planar design of the optical switches of the present invention is also compatible with conventional integrated optics geometry for placement on a processor board or microchip.

It will be further appreciated that the ability to readily selectively control the operations performed by the switches of each logic unit array 700 using program signals greatly increases the flexibility and capabilities of microcode programs which exploit the intrinsically parallel nature of the optical processing elements. At the same time, the architecture of the present invention is fully compatible with "data-flow" processing since it can handle, simultaneously, a multimode of data paths.

While the present invention has been described with reference to particular preferred embodiments, the invention is not limited to the specific examples given, and other embodiments and modifications can be made by those skilled in the art without departing from the spirit and scope of the invention.

What is claimed is:

1. A multiple-face optical device comprising a light-responsive element having multiple faces, at least two of said faces constituting input faces for receipt of non-collinear light signals and at least one of said faces other than said input faces constituting an output face from which light signals transmitted through said light-responsive element are emitted; said light-responsive element being further configured to have optically-induced non-linear susceptibility to light signals transversely propagated through said light-responsive element such that at least one portion of said light-responsive element switches between two stable optical states in dependence on the total intensity of the light signals within said light-responsive element.

2. The optical device of claim 1 wherein said two optical states consist of an OFF state, wherein passage of light signals through said at least one portion is prevented, when said total intensity is less than a predetermined threshold; and an ON state, wherein passage of light signals transversely through said at least one portion is permitted, when said total intensity is not less than said predetermined threshold.

3. The optical device of claim 2 wherein said light-responsive element comprises one or more Fabry-Perot resonators.

4. Optical switch apparatus for providing storage or time delay transmission of an optical data signal comprising:

a plurality of optical devices each comprising a light-responsive element having multiple faces, and being further configured to have first and second portions possessing substantially equal light sensitive non-linearly variable refractive indices, such that each portion switches from a first value to a second substantially different value in response to transversely propagated light signals within the portion having a total intensity equal to or greater than a threshold intensity; two of said faces respectively constituting a data signal input face and a first data signal output face for said first portion; said first and second portions being arranged to form an interface extending obliquely with respect to said data signal input face and said first data signal output face, such that a data signal having an intensity at least equal to said threshold intensity which is applied to the data signal input face of one of said optical devices will be reflected from the associated interface of the switch and outputted from the associated first data signal output face;

said plurality of optical devices being arranged to form a continuous loop data signal path whereby a data signal output from the first data output face of each optical device is received by the data signal input face of the next optical device in succession; and at least one of said optical devices having a program signal input face and a second data signal output face, opposite said data signal input face, forming a part of the second portion thereof, such that a program signal having an intensity at least equal to said threshold intensity applied to said program signal input face causes a data signal applied to the associated data signal input face of said at least one of said optical devices to pass through the switch without substantial reflection at the associated interface thereof and to exit from the associated second data output signal face, rather than continuing to follow said continuous loop data signal path.

5. Optical switch multiple cell memory apparatus for simultaneous transfer of data from a plurality of cells in response to a single optical read signal comprising:

a plurality of bistable optical switch means defining an array of memory locations arranged in a first plane, each of said switch means being switchable from a first state, wherein light propagating orthogonally to said first plane cannot pass through the switch means, in response to transversely propagating light signals within the switch means having a total light intensity which equals or exceeds a threshold intensity; and a plurality of photosensitive elements arranged in a corresponding array in a second plane spaced from and aligned with said first plane so as to receive light signals produced by those ones of said switch means which are in said second state when said plurality of switch means is illuminated by an orthogonally directed optical read signal.

6. A programmable optical logic array device for parallel processing of at least one set of first and second non-collinear data signals along first and second data paths comprising:

AND/OR optical device means controllable by a first optical program signal for selectively operating in an AND or an OR logic mode to produce corresponding first and/or second data output signals in dependence on the combination of data input signals present and the logic mode selected;

PASS/INVERT optical device means responsive to one of said first and second data output signals from said AND/OR optical device means and controllable by a second optical program signal for selectively operating in PASS or INVERT modes wherein, respectively, a PASS data output signal is produced in the same data path when said one of said first and second data output signals is present, and an INVERT data output signal is produced in a different data path when said one of said first and second data output signals is not present; and BRANCHING optical device means responsive to said PASS and INVERT data output signals from said PASS/INVERT optical device means and controllable by a third optical program signal for selectively operating to transfer PASS and INVERT data output signals applied as inputs along the same data path as, or a different data path from, the data path on which the applied PASS/INVERT signal was travelling prior to transfer.

7. The programmable optical logic array of claim 6 wherein said AND/OR optical device means comprises a single cell light-responsive element having planar top and bottom faces and a polygonal shape defining multiple faces, two of said faces constituting input faces for receipt of said first and second data signals, respectively; two of said faces respectively opposite said input faces constituting output faces from which said first and second data output signals are respectively emitted; and one of said faces not constituting an input or an output face constituting a program signal input face for said first program signal; said light-responsive element being further configured to have optically-induced non-linear susceptibility to light signals transversely propagated through said light-responsive element such that said light-responsive element switches from an OFF state, wherein passage of light signals transversely through said light-responsive element is prevented, and an ON state, wherein passage of light signals transversely through said light-responsive element is permitted, when the total intensity of the light signals within said light-responsive element equals or exceeds a predetermined threshold, the value of said threshold relative to the intensities of said first and second data signals and said program signal being selected such that the intensities of none of said first and second data signals and said first program signal individually equal or exceed said threshold, but the combined intensities of any two of said first and second data signals and said first program signal at least equals said threshold, and said AND/OR switch means thereby operates in said AND logic mode when said first program signal is absent and in said OR logic mode when said first program signal is present.

* * * * *